(12) United States Patent
Okoli et al.

(10) Patent No.: US 12,010,825 B2
(45) Date of Patent: Jun. 11, 2024

(54) EYEWEAR WITH RF SHIELDING HAVING GROUNDING SPRINGS

(71) Applicants: Chukwubuikem Marcel Okoli, Los Angeles, CA (US); Ugur Olgun, West Hollywood, CA (US); Stephen Andrew Steger, Los Angeles, CA (US)

(72) Inventors: Chukwubuikem Marcel Okoli, Los Angeles, CA (US); Ugur Olgun, West Hollywood, CA (US); Stephen Andrew Steger, Los Angeles, CA (US)

(73) Assignee: Snap Inc., Santa Monica, CA (US)

( * ) Notice: Subject to any disclaimer, the term of this patent is extended or adjusted under 35 U.S.C. 154(b) by 249 days.

(21) Appl. No.: 17/694,860

(22) Filed: Mar. 15, 2022

(65) Prior Publication Data

US 2023/0301045 A1 Sep. 21, 2023

(51) Int. Cl.
*H05K 9/00* (2006.01)
*G02B 27/01* (2006.01)

(52) U.S. Cl.
CPC ......... *H05K 9/0037* (2013.01); *G02B 27/017* (2013.01); *H05K 9/0035* (2013.01); *H05K 9/0039* (2013.01); *G02B 2027/0178* (2013.01)

(58) Field of Classification Search
CPC ... H05K 9/0035; H05K 9/0037; H05K 9/0039
USPC .......................................... 361/818, 799, 816
See application file for complete search history.

(56) References Cited

U.S. PATENT DOCUMENTS

| | | | | |
|---|---|---|---|---|
| 2004/0018758 | A1* | 1/2004 | Yoshinaga | H01R 12/00 439/92 |
| 2006/0189183 | A1* | 8/2006 | Yang | H01R 13/6583 439/95 |
| 2008/0273165 | A1 | 11/2008 | Mankovitz et al. | |
| 2011/0085317 | A1* | 4/2011 | Nagata | H01R 13/6658 361/818 |

(Continued)

FOREIGN PATENT DOCUMENTS

| | | | |
|---|---|---|---|
| CN | 215006134 U | 12/2021 | |
| JP | 2007123722 A | * 5/2007 | H05K 9/00 |

(Continued)

OTHER PUBLICATIONS

International Search Report and Written Opinion received in Patent Cooperation Treaty Application No. PCT/US2023/014134, dated Jun. 29, 2023, 9 pages.

*Primary Examiner* — Hung S. Bui
(74) *Attorney, Agent, or Firm* — Culhane PLLC; Stephen J. Weed

(57) ABSTRACT

A shield can for an electronic eyewear device is described that reduces RF signals emanating from the electronic eyewear device. The shield can is attached to a ground plate of the electronic eyewear device using leaf springs on a side of the shield can. The leaf springs do not add to the stack-up thickness of the shield can assembly and provide a balanced force against the ground plate. The shield can is attached to a printed circuit board and encompasses radio frequency (RF) electronic components to prevent RF signals emanating from the RF electronic components. The leaf springs have a pair of fingers providing the balanced mechanical point force. A conductive pressure sensitive adhesive is also provided to secure a top surface of the shield can to the ground plate along with a thermal paste.

15 Claims, 15 Drawing Sheets

(56) References Cited

U.S. PATENT DOCUMENTS

2012/0257369 A1\* 10/2012 Zhao .................... H05K 9/0016
174/351
2019/0271856 A1 9/2019 Mape et al.

FOREIGN PATENT DOCUMENTS

| JP | 2012064737 A | \* | 3/2012 | ............... H05K 9/00 |
| KR | 1020200142905 A | | 12/2020 | |
| WO | 2020161882 A1 | | 8/2020 | |

\* cited by examiner

EYEWEAR WITH RF SHIELDING HAVING GROUNDING SPRINGS

TECHNICAL FIELD

The present subject matter relates to an electronic eyewear device, e.g., smart glasses having cameras and see-through displays, having radio frequency (RF) shielding.

BACKGROUND

Electronic eyewear devices, such as smart glasses, headwear, and headgear available today integrate cameras, see-through displays, and antennas. Such devices produce RF signals that may interfere with the operation of other electronic devices.

BRIEF DESCRIPTION OF THE DRAWINGS

The drawing figures depict one or more implementations, by way of example only, not by way of limitations. In the figures, like reference numerals refer to the same or similar elements.

Features of the various implementations disclosed will be readily understood from the following detailed description, in which reference is made to the appended drawing figures. A reference numeral is used with each element in the description and throughout the several views of the drawing. When a plurality of similar elements is present, a single reference numeral may be assigned to like elements, with an added letter referring to a specific element.

Figure 1A:
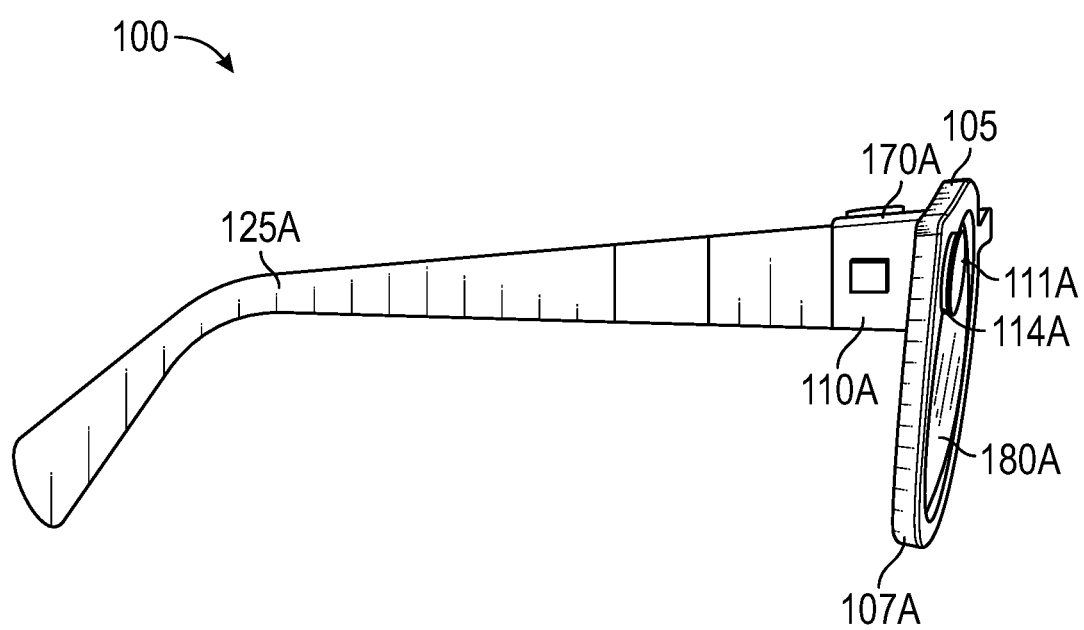
Figure 1B:
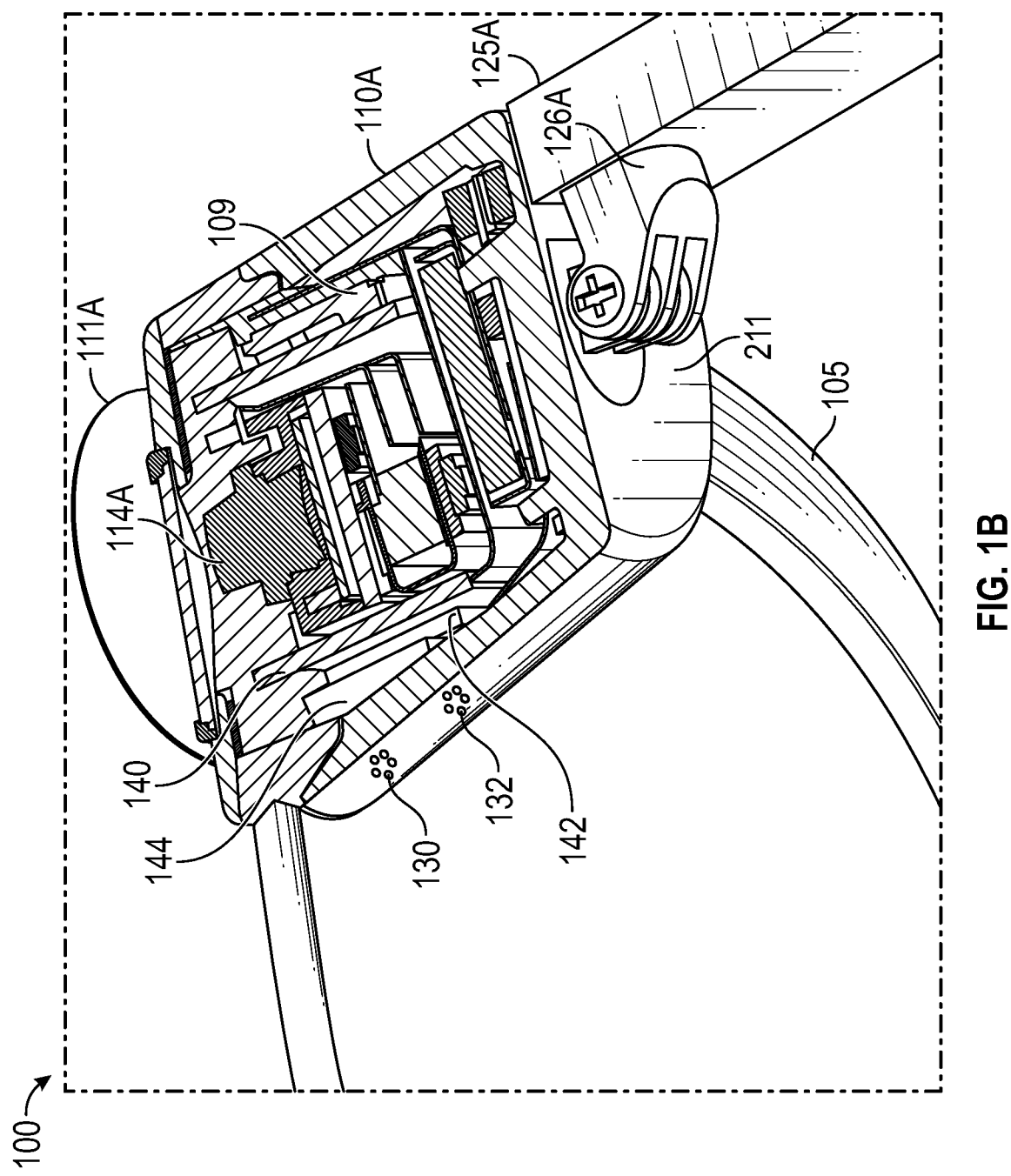
Figure 2A:
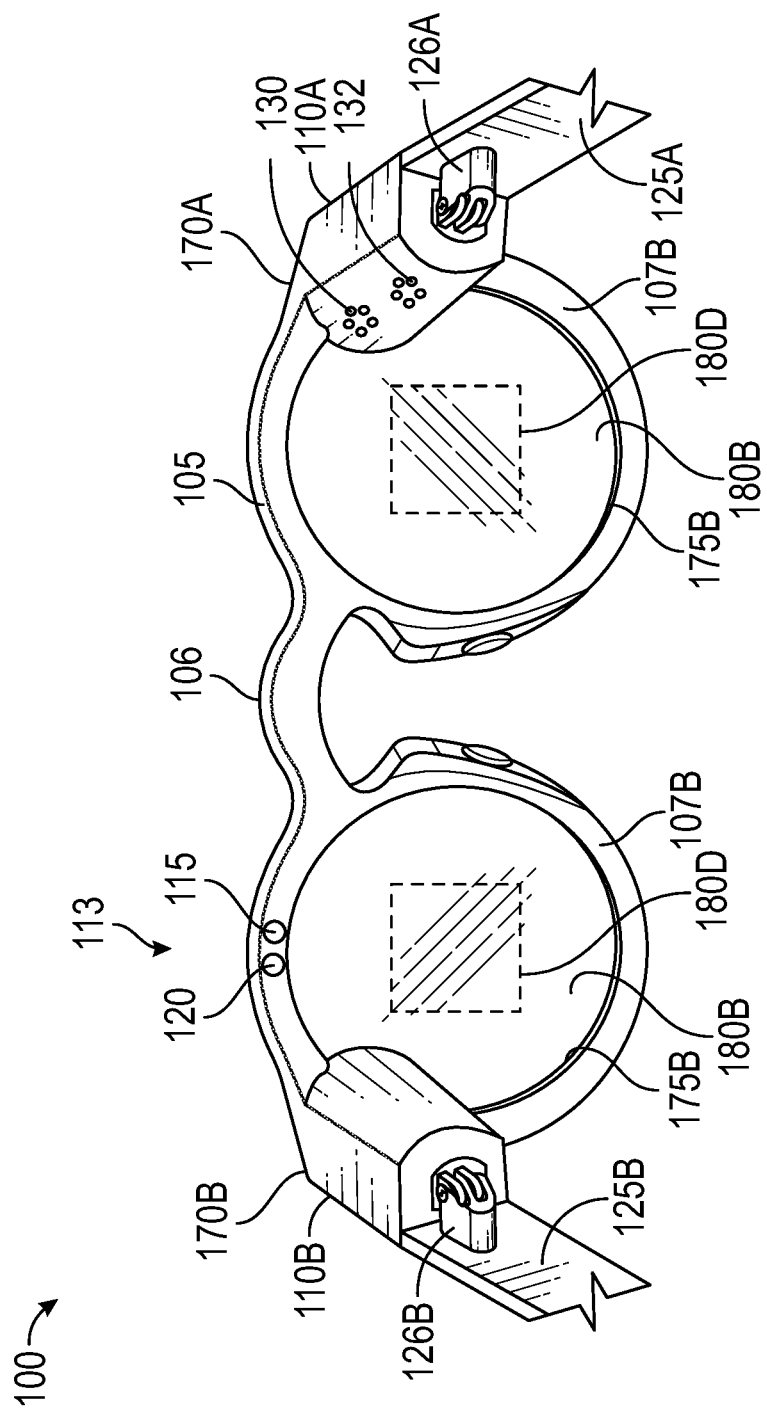
Figure 2B:
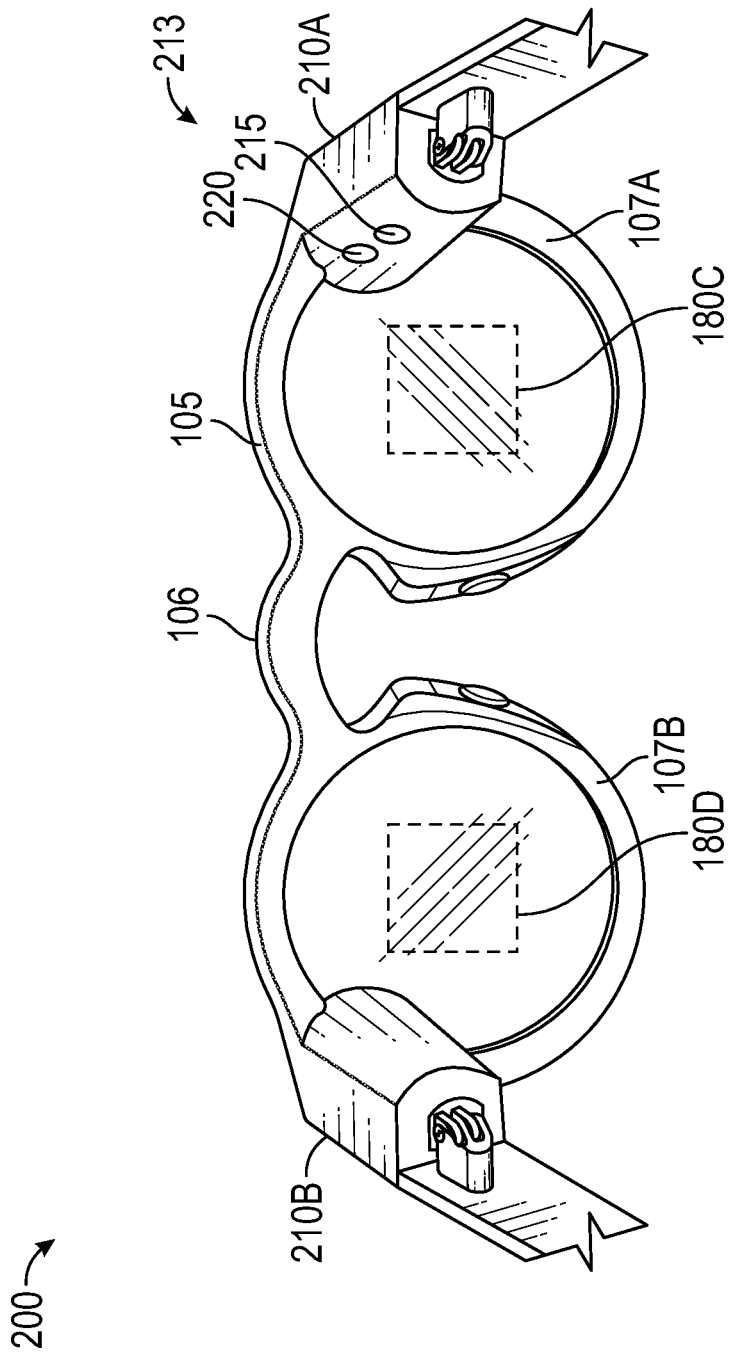
Figure 2C:
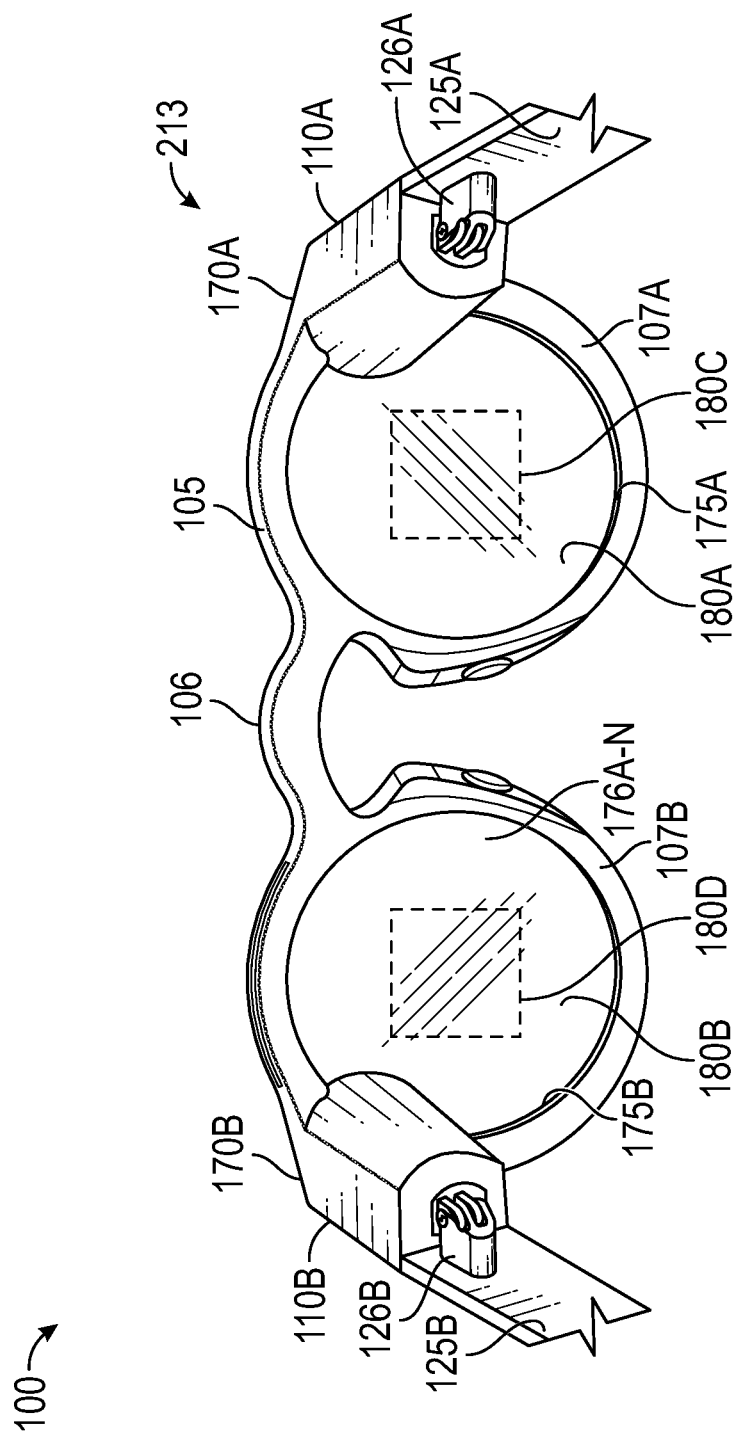
Figure 2D:
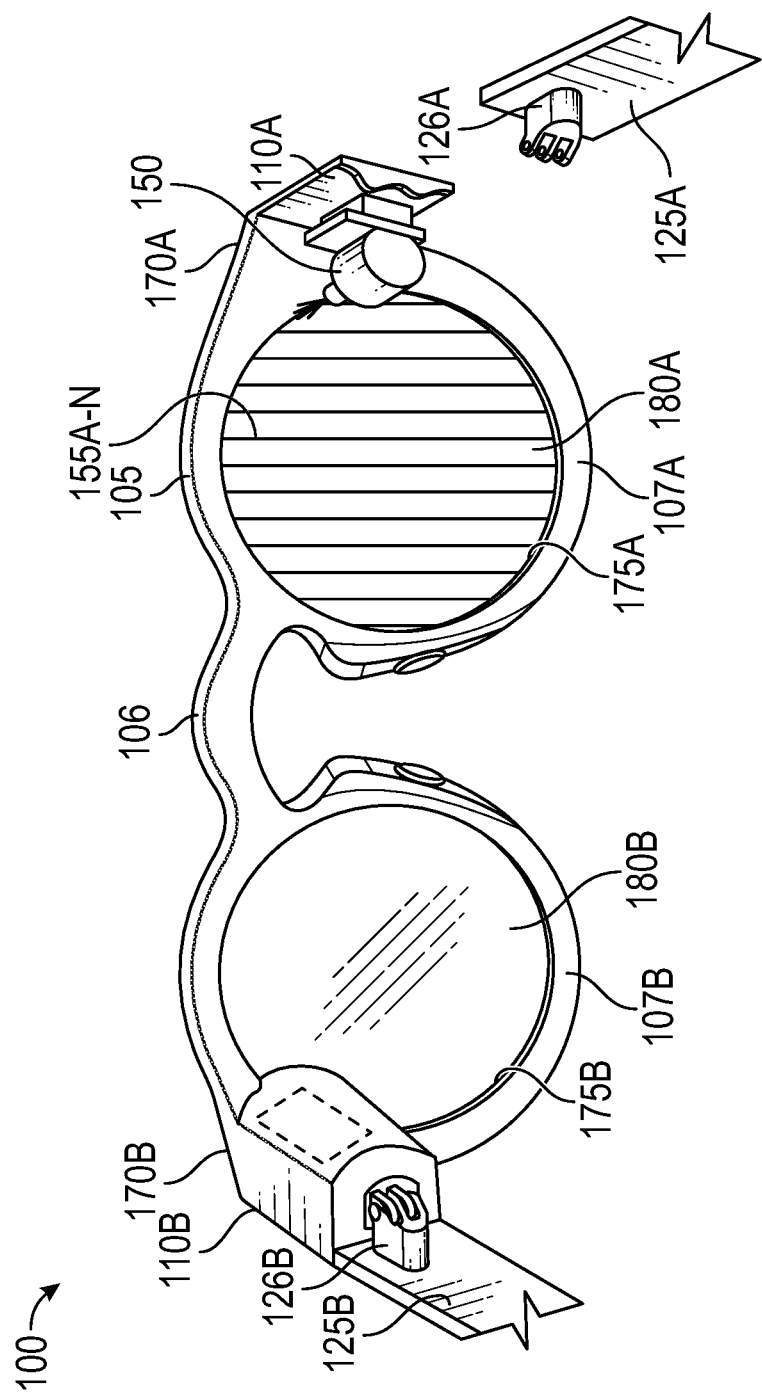
Figure 3:
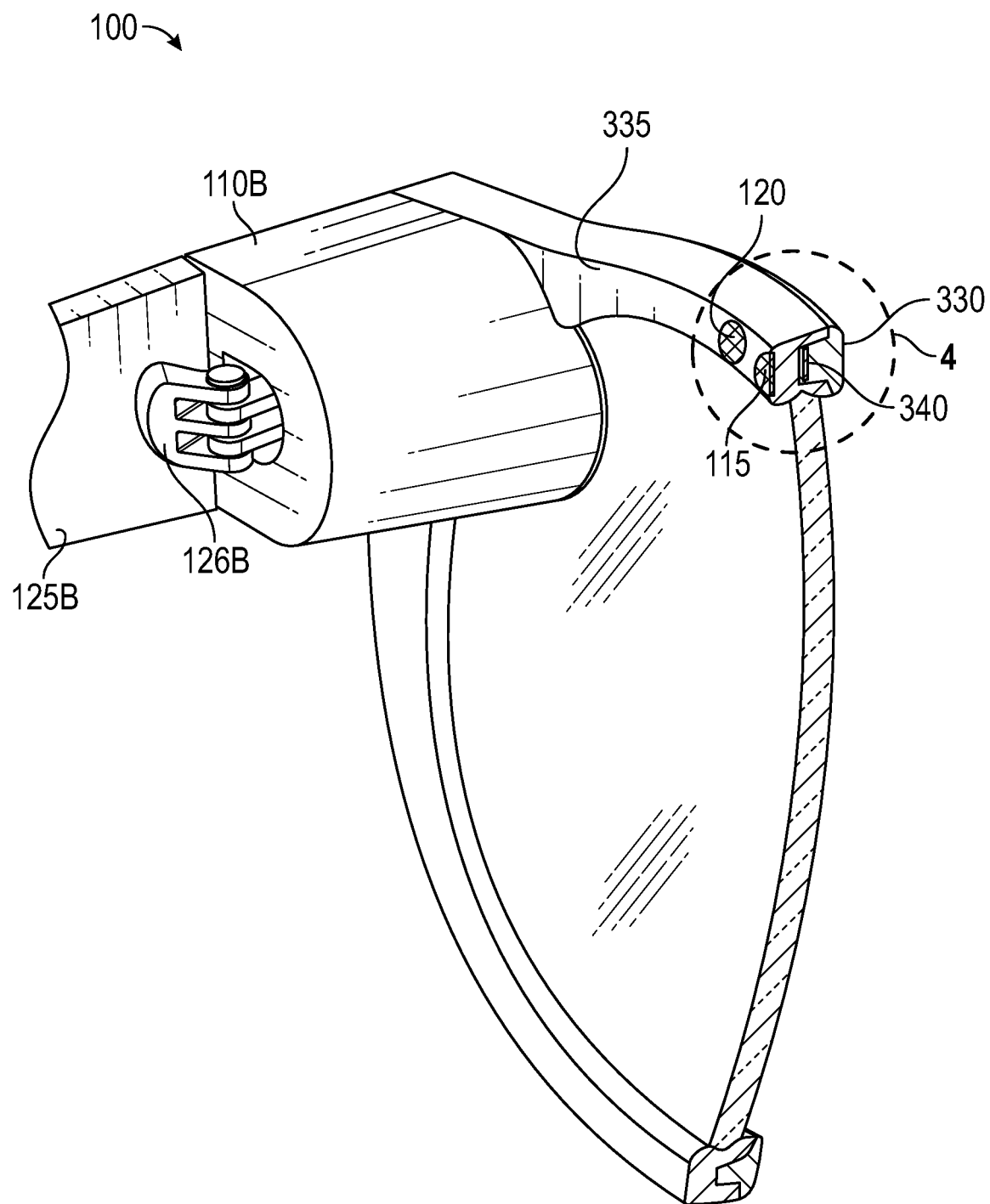
Figure 4:
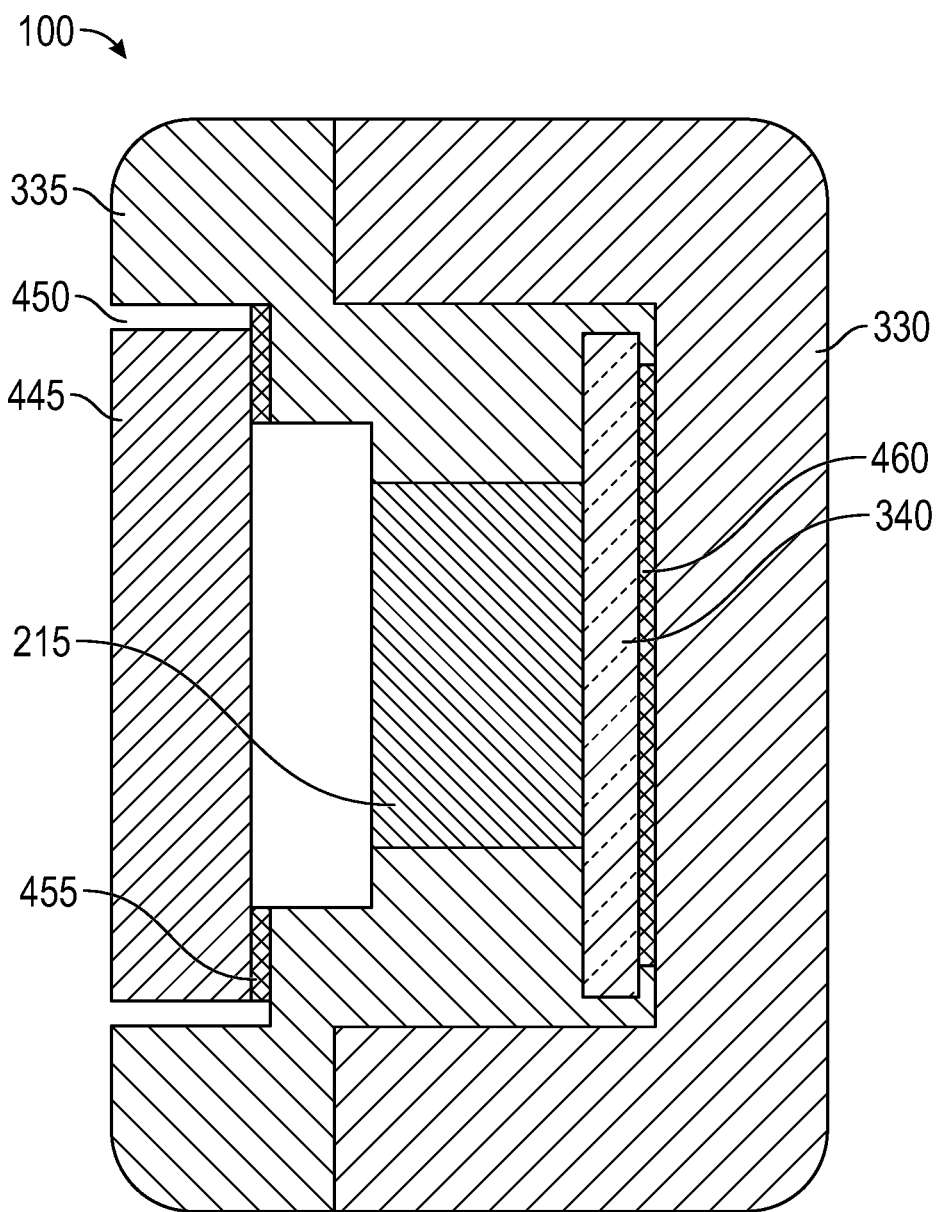
Figure 5:
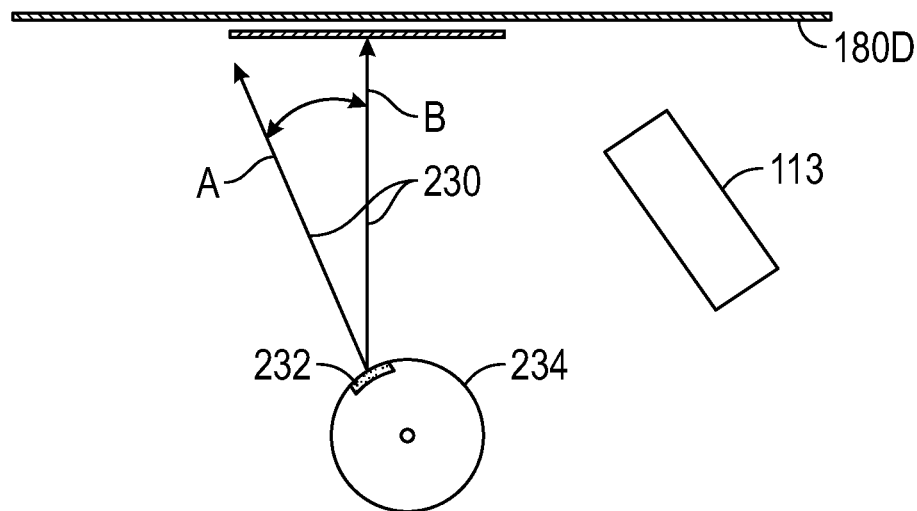
Figure 6:
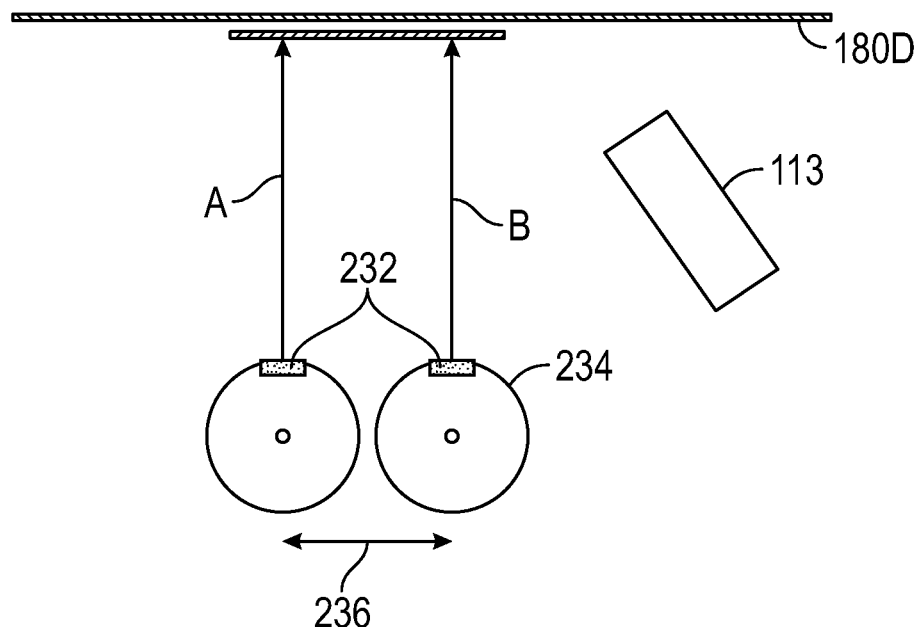
Figure 7:
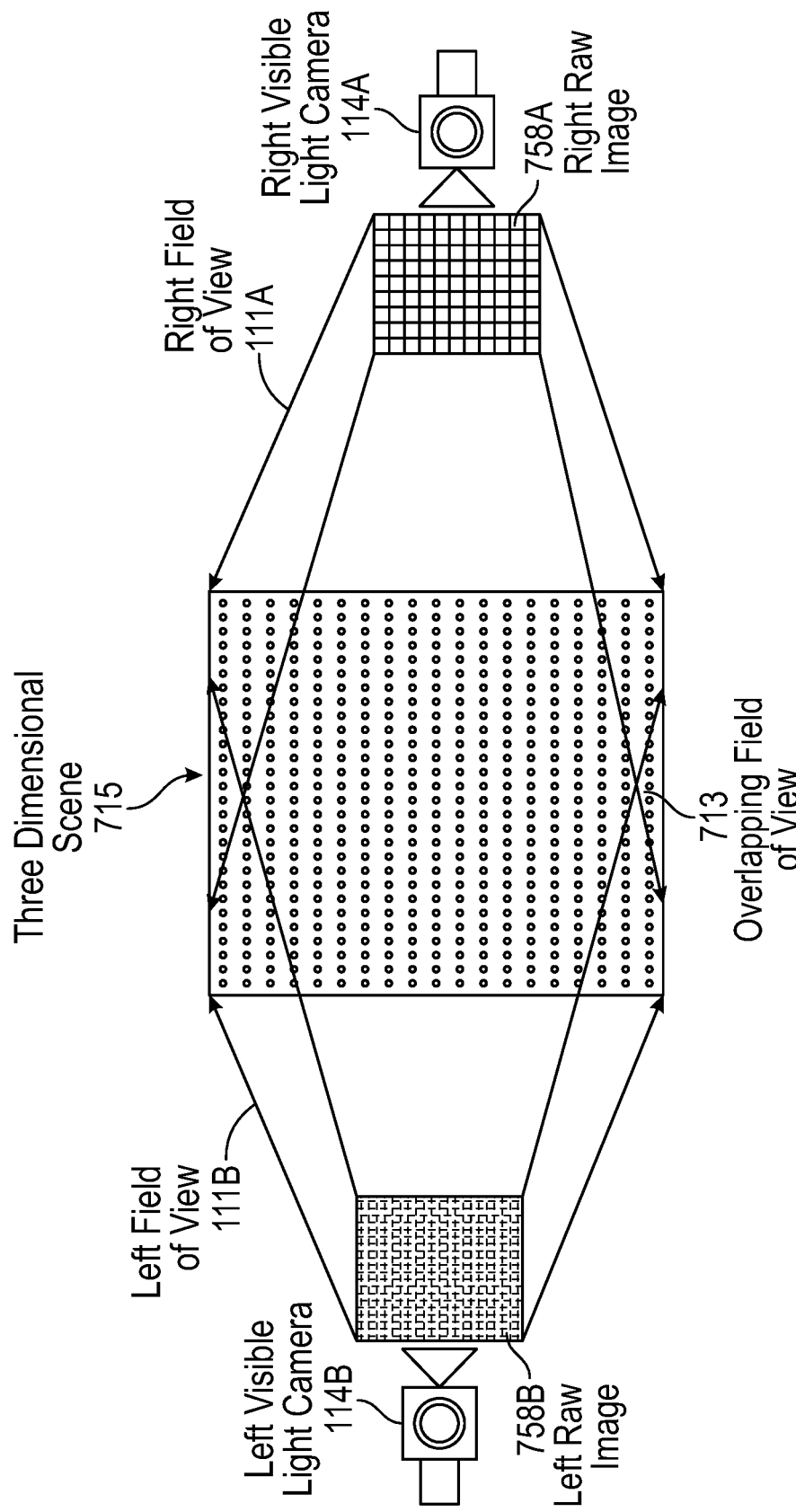
Figure 8A:
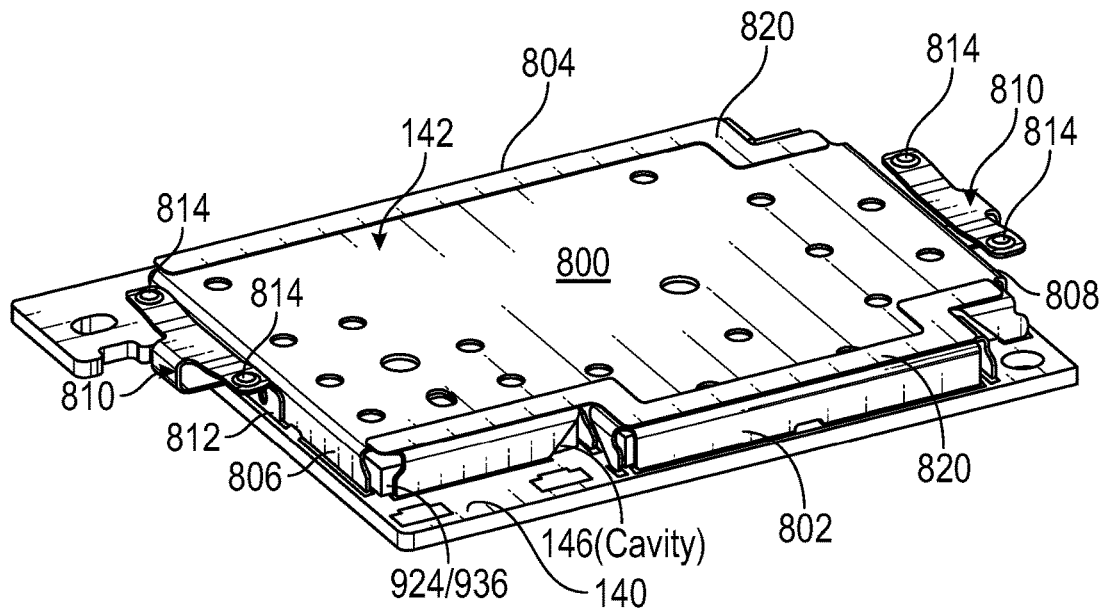
Figure 8B:
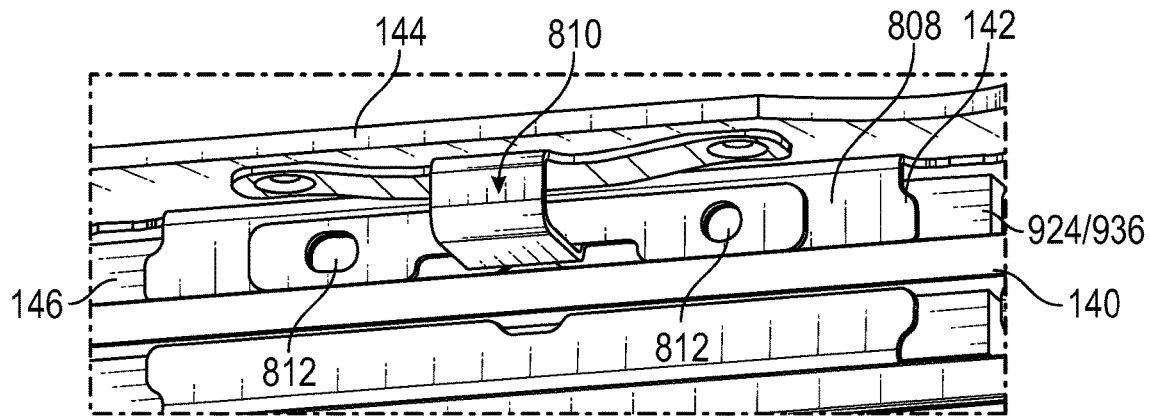
Figure 8C:
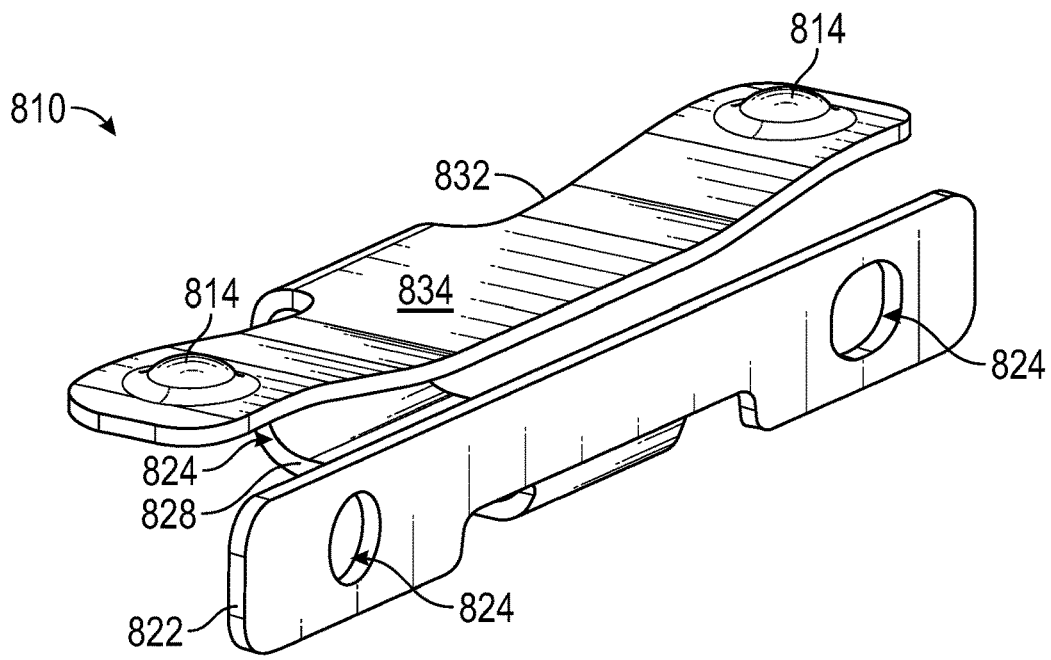
Figure 8D:
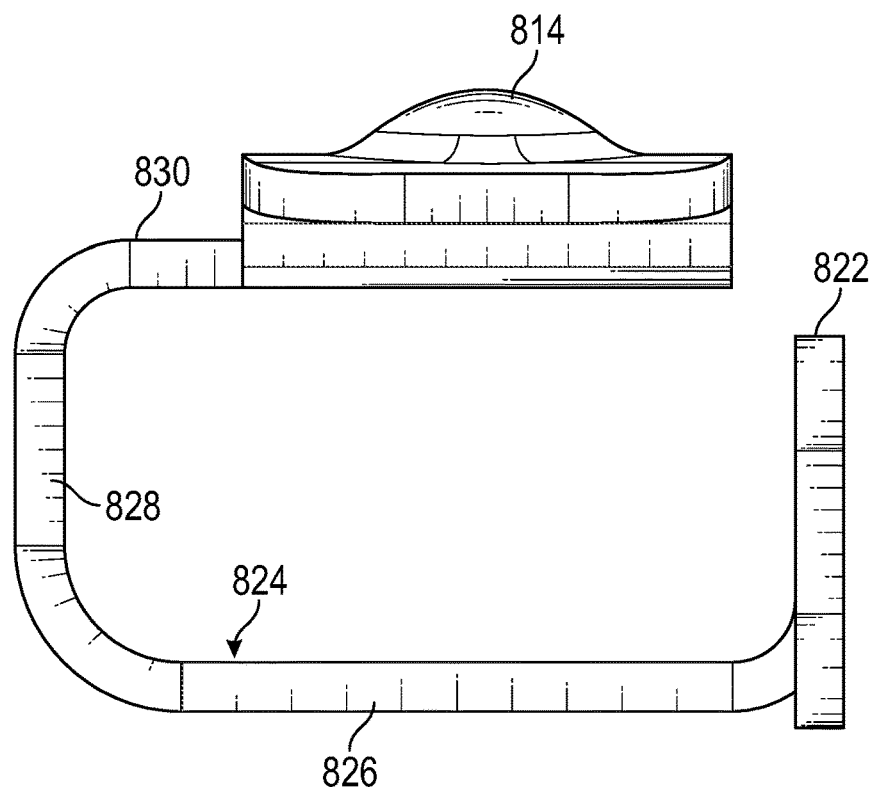
Figure 9:
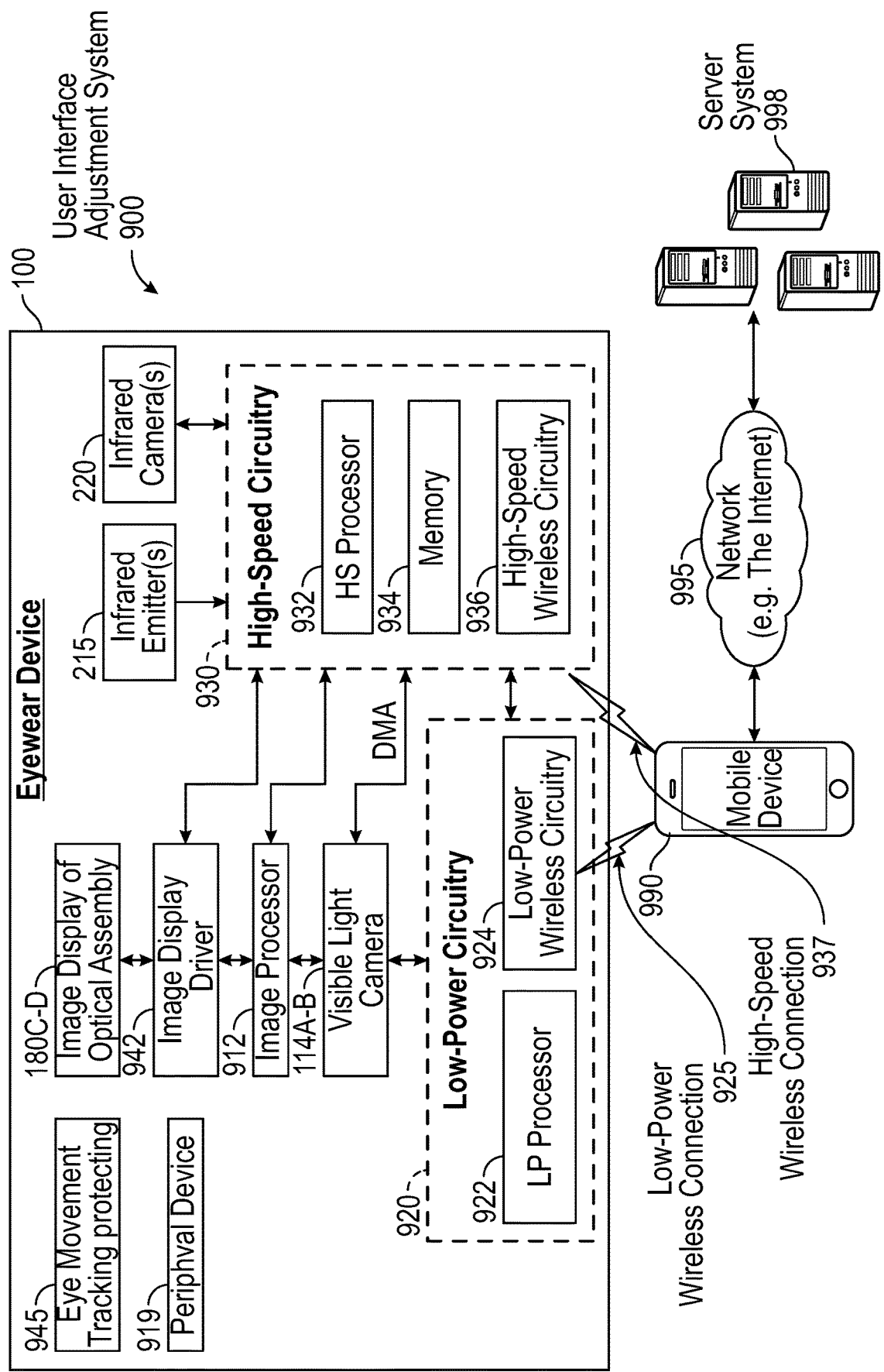
Figure 10:
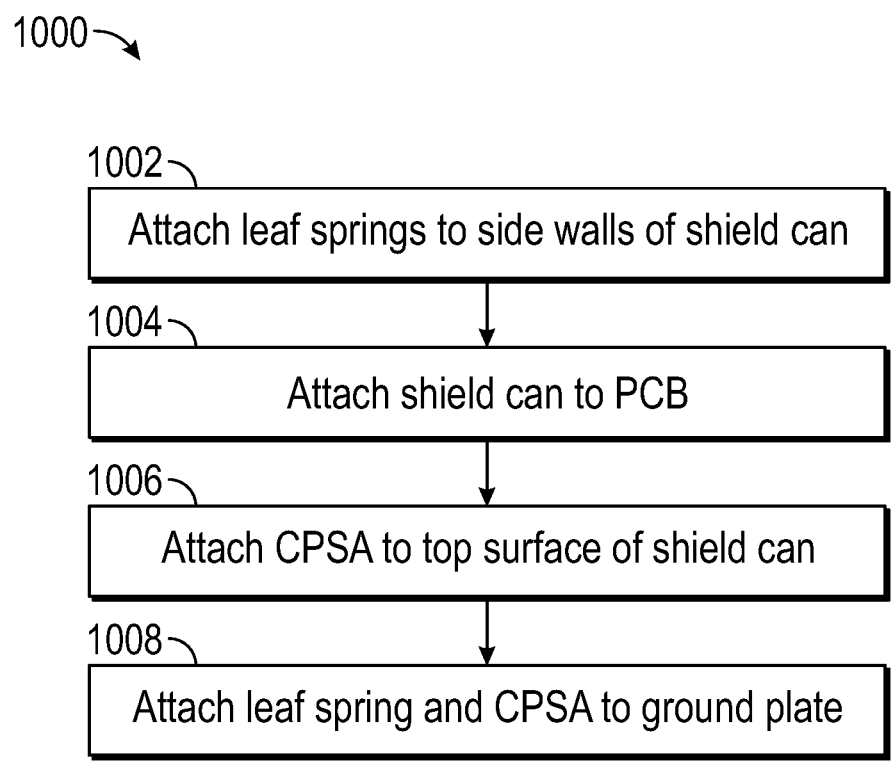
Figure 11:
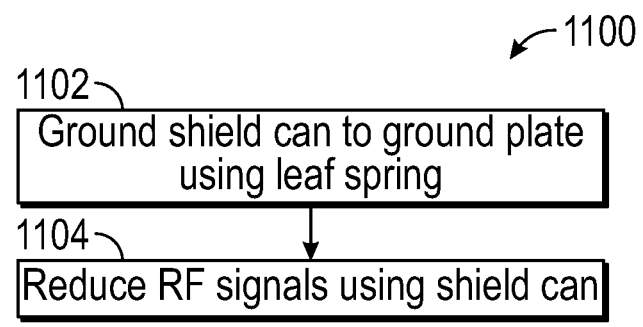

The various elements shown in the figures are not drawn to scale unless otherwise indicated. The dimensions of the various elements may be enlarged or reduced in the interest of clarity. The several figures depict one or more implementations and are presented by way of example only and should not be construed as limiting. Included in the drawing are the following figures:

FIG. 1A is a side view of an example electronic eyewear device including an optical assembly with an image display;

FIG. 1B is a top cross-sectional view of optical components and electronics in a portion of the electronic eyewear device illustrated in FIG. 1A;

FIG. 2A is a rear view of an example electronic eyewear device;

FIG. 2B is a rear view of an example electronic eyewear device;

FIG. 2C is a rear view of an example electronic eyewear device depicting an image display;

FIG. 2D is a rear view of an example electronic eyewear device depicting an image display;

FIG. 3 is a cross-sectional rear perspective view of the electronic eyewear device of FIG. 2A depicting an infrared emitter, an infrared camera, a frame front, a frame back, and a circuit board;

FIG. 4 is a cross-sectional view through the infrared emitter and the frame of the electronic eyewear device of FIG. 3;

FIG. 5 is a top view illustrating detection of eye gaze direction;

FIG. 6 is a top view illustrating detection of eye position;

FIG. 7 is a block diagram depicting capture of visible light by visible light cameras;

FIG. 8A is a perspective view of a shield can secured to a printed circuit board and having leaf springs secured to side walls of the shield can with protrusions facing upwardly;

FIG. 8B is a side perspective view of a side wall of the shield can of FIG. 8A including a leaf spring secured to a ground plate;

FIG. 8C is a perspective view of the leaf spring of FIG. 8B;

FIG. 8D is a side view of the leaf spring of FIG. 8A;

FIG. 9 is a block diagram of electronic components of the electronic eyewear device;

FIG. 10 is a flowchart of attaching the shield can to the ground plate and the printed circuit board; and FIG. 11 is a flowchart of using the shield can including the leaf springs to ground the shield can.

DETAILED DESCRIPTION

Electronic eyewear devices include electronic components that emit RF signals. A shield can for an electronic eyewear device reduces RF signals emanating from the electronic eyewear device. Examples described include an electronic eyewear device having a shield can attached to a ground plate using leaf springs, where the leaf springs are attached to a side of the shield can. Attaching the leaf springs to the side of the shield can does not add height ("stack-up thickness") to the shield can assembly. The leaf springs have a pair of fingers generating a balanced mechanical point force against the ground plate. The shield can is attached to a printed circuit board and encompasses radio frequency (RF) electronic components to prevent RF signals emanating from these components outside of the electronic eyewear device. A conductive pressure sensitive adhesive secures a top surface of the shield can to the ground plate along with a thermal paste.

Additional objects, advantages and novel features of the examples will be set forth in part in the description which follows, and in part will become apparent to those skilled in the art upon examination of the following and the accompanying drawings or may be learned by production or operation of the examples. The objects and advantages of the present subject matter may be realized and attained by means of the methodologies, instrumentalities and combinations particularly pointed out in the appended claims.

In the following detailed description, numerous specific details are set forth by way of examples to provide a thorough understanding of the relevant teachings. However, it should be apparent to those skilled in the art that the present teachings may be practiced without such details. In other instances, well known methods, procedures, components, and circuitry have been described at a relatively high-level, without detail, to avoid unnecessarily obscuring aspects of the present teachings.

The term "coupled" as used herein refers to any logical, optical, physical or electrical connection, link or the like by which signals or light produced or supplied by one system element are imparted to another coupled element. Unless described otherwise, coupled elements or devices are not necessarily directly connected to one another and may be separated by intermediate components, elements or communication media that may modify, manipulate, or carry the light or signals.

The orientations of the electronic eyewear device, associated components and any complete devices incorporating an eye scanner and camera such as shown in any of the drawings, are given by way of example only, for illustration and discussion purposes. In operation for a particular variable optical processing application, the electronic eyewear device may be oriented in any other direction suitable to the particular application of the electronic eyewear device, for example up, down, sideways, or any other orientation. Also, to the extent used herein, any directional term, such as front, rear, inwards, outwards, towards, left, right, lateral, longitudinal, up, down, upper, lower, top, bottom and side, are used by way of example only, and are not limiting as to direction or orientation of any optic or component of an optic constructed as otherwise described herein.

Reference now is made in detail to the examples illustrated in the accompanying drawings and discussed below.

FIG. 1A is an illustration depicting a side view of an example hardware configuration of an electronic eyewear device 100 including an optical assembly 180A with an image display 180C (FIG. 2A). Electronic eyewear device 100 includes multiple visible light cameras 114A and 114B (FIG. 3) that form a stereo camera, of which the first visible light camera 114A is located on a right temple 110A and the second visible light camera 114B is located on a left temple 110B (FIG. 2A). In the illustrated example, the optical assembly 180A is located on the right side of the electronic eyewear device 100. The optical assembly 180A can be located on the left side or other locations of the electronic eyewear devices 100.

The visible light cameras 114A and 114B may include an image sensor that is sensitive to the visible light range wavelength. Each of the visible light cameras 114A and 114B has a different frontward facing angle of coverage, for example, visible light camera 114A has the depicted angle of coverage 111A (FIG. 3). The angle of coverage is an angle range in which the respective image sensor of the visible light cameras 114A and 114B detects incoming light and generates image data. Examples of such visible lights cameras 114A and 114B include a high-resolution complementary metal-oxide-semiconductor (CMOS) image sensor and a video graphic array (VGA) camera, such as 640p (e.g., 640×480 pixels for a total of 0.3 megapixels), 720p, 1080p, 4K, or 8K. Image sensor data from the visible light cameras 114A and 114B may be captured along with geolocation data, digitized by an image processor, and stored in a memory.

To provide stereoscopic vision, visible light cameras 114A and 114B may be coupled to an image processor (element 412 of FIG. 4) for digital processing and adding a timestamp corresponding to the scene in which the image is captured. Image processor 412 may include circuitry to receive signals from the visible light cameras 114A and 114B and to process those signals from the visible light cameras 114A and 114B into a format suitable for storage in the memory (element 434 of FIG. 4). The timestamp may be added by the image processor 412 or other processor that controls operation of the visible light cameras 114A and 114B. Visible light cameras 114A and 114B allow the stereo camera to simulate human binocular vision. Stereo cameras also provide the ability to reproduce three-dimensional images of a three-dimensional scene (scene 315 of FIG. 3) based on two captured images (image pairs 358A and 358B of FIG. 3) from the visible light cameras 114A and 114B, respectively, having the same timestamp. Such three-dimensional images allow for an immersive virtual experience that feels realistic, e.g., for virtual reality or video gaming. For stereoscopic vision, the pair of images 358A and 358B may be generated at a given moment in time—one image for each of the visible light cameras 114A and 114B. When the pair of generated images 358A and 358B from the frontward facing field of view (FOV) 111A and 111B of the visible light cameras 114A and 114B are stitched together (e.g., by the image processor 412), depth perception is provided by the optical assemblies 180A and 180B.

In an example, the electronic eyewear device 100 includes a frame 105, a right rim 107A, a right temple 110A extending from a right lateral side 170A of the frame 105, and a see-through image display 180C (FIGS. 2A-B) comprising optical assembly 180A to present a GUI or other image to a user. The electronic eyewear device 100 includes the first visible light camera 114A connected to the frame 105 or the right temple 110A to capture a first image of the scene. Electronic eyewear device 100 further includes the second visible light camera 114B connected to the frame 105 or the left temple 110B to capture (e.g., simultaneously with the first visible light camera 114A) a second image of the scene which at least partially overlaps the first image. Although not shown in FIGS. 1A and 1B, a high speed (HS) processor 932 (FIG. 9) is coupled to the electronic eyewear device 100 and is connected to the visible light cameras 114A and 114B and memory 934 (FIG. 9) accessible to the processor 932, and programming in the memory 934 may be provided in the electronic eyewear device 100 itself.

Although not shown in FIG. 1A, the electronic eyewear device 100 also may include a head movement tracker (element 109 of FIG. 1B) or an eye movement tracker (element 113 of FIG. 2A or element 213 of FIGS. 2B and 2C). Electronic eyewear device 100 may further include the see-through image displays 180C and D of optical assemblies 180A and 180B, respectively, for presenting a sequence of displayed images. The electronic eyewear devices 100 may further include an image display driver (element 942 of FIG. 9) coupled to the see-through image displays 180C and 180D to drive the image displays 180C and 180D. The see-through image displays 180C and 180D and the image display driver are described in further detail below. Electronic eyewear device 100 may further include the memory 934 and the processor 932 (FIG. 4) having access to the image display driver 942 and the memory 934, as well as programming in the memory 934. Execution of the programming by the processor 932 configures the electronic eyewear device 100 to perform functions, including functions to present, via the see-through image displays 180C and 180D, an initial displayed image of the sequence of displayed images, the initial displayed image having an initial field of view corresponding to an initial head direction or an initial eye gaze direction as determined by the eye movement tracker 113 or 213.

Execution of the programming by the processor 932 may further configure the electronic eyewear device 100 to detect movement of a user of the electronic eyewear device 100 by: (i) tracking, via the head movement tracker (element 109 of FIG. 1B), a head movement of a head of the user, or (ii) tracking, via an eye movement tracker (element 113 of FIG. 2A or element 213 of FIGS. 2B and 2C), an eye movement of an eye of the user of the electronic eyewear device 100. Execution of the programming by the processor 932 may further configure the electronic eyewear device 100 to determine a field of view adjustment to the initial field of view of the initial displayed image based on the detected movement of the user. The field of view adjustment may include a successive field of view corresponding to a successive head direction or a successive eye direction. Execution of the programming by the processor 932 may further configure the electronic eyewear device 100 to generate successive displayed images of the sequence of displayed images based on the field of view adjustment. Execution of the programming by the processor 932 may further configure the electronic eyewear device 100 to present, via the see-through image displays 180C and 180D of the optical assemblies 180A and 180B, the successive displayed images.

FIG. 1B is an illustration depicting a top cross-sectional view of optical components and electronics in a portion of the electronic eyewear device 100 illustrated in FIG. 1A depicting the first visible light camera 114A, a head movement tracker 109, and a circuit board 140A. Construction and placement of the second visible light camera 114B is substantially similar to the first visible light camera 114A, except the connections and coupling are on the other lateral side 170B (FIG. 2A). As shown, the electronic eyewear device 100 includes the first visible light camera 114A and a circuit board, which may be a flexible printed circuit board (PCB) 140A. A first hinge 126A connects the right temple 110A to a hinged arm 125A of the electronic eyewear device 100. In some examples, components of the first visible light camera 114A, the flexible PCB 140A, or other electrical connectors or contacts may be located on the right temple 110A or the first hinge 126A.

Also shown in FIG. 1B is an electrically conductive shield can 142 coupled to, and disposed between, a RF ground plate 144 and a printed circuit board (PCB) 140. The ground plate 144 can be any number of objects including a heatsink, a vapor chamber, another PCB, or some other piece of metal that needs to be grounded. The shield can 142 has a cavity 146 (further described below in connection with FIG. 8A and FIG. 8B) that encompasses RF electronic components, such as low-power wireless circuitry 924 and high-speed wireless circuitry 936 (FIG. 9), and the shield can provide an RF ground to the RF electrical components. The shield can 142 provides an RF shield to prevent spurious RF signals from emitting outside of the shield can. The shield can 142 also provides a ground for safety and electro-static discharge protection and can form as part of an antenna design such as a ground plane. The ground plate 144 may be planar, but it can also be non-planar if desired. This shield can 142 is discussed in more detail in reference to FIGS. 8A-8D.

As shown, electronic eyewear device 100 may include a head movement tracker 109, which includes, for example, an inertial measurement unit (IMU). An inertial measurement unit is an electronic device that measures and reports a body's specific force, angular rate, and sometimes the magnetic field surrounding the body, using a combination of accelerometers and gyroscopes, sometimes also magnetometers. The inertial measurement unit works by detecting linear acceleration using one or more accelerometers and rotational rate using one or more gyroscopes. Typical configurations of inertial measurement units contain one accelerometer, gyroscope, and magnetometer per axis for each of the three axes: horizontal axis for left-right movement (X), vertical axis (Y) for top-bottom movement, and depth or distance axis for up-down movement (Z). The accelerometer detects the gravity vector. The magnetometer defines the rotation in the magnetic field (e.g., facing south, north, etc.) like a compass that generates a heading reference. The three accelerometers detect acceleration along the horizontal, vertical, and depth axis defined above, which can be defined relative to the ground, the electronic eyewear device 100, or the user wearing the electronic eyewear device 100.

Electronic eyewear device 100 may detect movement of the user of the electronic eyewear device 100 by tracking, via the head movement tracker 109, the head movement of the user's head. The head movement includes a variation of head direction on a horizontal axis, a vertical axis, or a combination thereof from the initial head direction during presentation of the initial displayed image on the image display. In one example, tracking, via the head movement tracker 109, the head movement of the user's head includes measuring, via the inertial measurement unit, the initial head direction on the horizontal axis (e.g., X axis), the vertical axis (e.g., Y axis), or the combination thereof (e.g., transverse or diagonal movement). Tracking, via the head movement tracker 109, the head movement of the user's head further includes measuring, via the inertial measurement unit, a successive head direction on the horizontal axis, the vertical axis, or the combination thereof during presentation of the initial displayed image.

Tracking, via the head movement tracker 109, the head movement of the user's head may include determining the variation of head direction based on both the initial head direction and the successive head direction. Detecting movement of the user of the electronic eyewear device 100 may further include in response to tracking, via the head movement tracker 109, the head movement of the user's head, determining that the variation of head direction exceeds a deviation angle threshold on the horizontal axis, the vertical axis, or the combination thereof. In sample configurations, the deviation angle threshold is between about 3° to 10°. As used herein, the term "about" when referring to an angle means±10% from the stated amount.

Variation along the horizontal axis slides three-dimensional objects, such as characters, Bitmojis, application icons, etc. in and out of the field of view by, for example, hiding, unhiding, or otherwise adjusting visibility of the three-dimensional object. Variation along the vertical axis, for example, when the user looks upwards, in one example, displays weather information, time of day, date, calendar appointments, etc. In another example, when the user looks downwards on the vertical axis, the electronic eyewear device 100 may power down.

As shown in FIG. 1B, the right temple 110A includes temple body 211 that is configured to receive a temple cap, with the temple cap omitted in the cross-section of FIG. 1B. Disposed inside the right temple 110A are various interconnected circuit boards, such as PCBs or flexible PCBs 140A, that include controller circuits for first visible light camera 114A, microphone(s) 130, speaker(s) 132, low-power wireless circuitry (e.g., for wireless short-range network communication via BLUETOOTH®), and high-speed wireless circuitry (e.g., for wireless local area network communication via WI-FI® and positioning via GPS).

The first visible light camera 114A is coupled to or disposed on the flexible PCB 140A and covered by a visible light camera cover lens, which is aimed through opening(s) formed in the right temple 110A. In some examples, the frame 105 connected to the right temple 110A includes the opening(s) for the visible light camera cover lens. The frame 105 may include a front-facing side configured to face outwards away from the eye of the user. The opening for the visible light camera cover lens may be formed on and through the front-facing side. In the example, the first visible light camera 114A has an outward facing angle of coverage 111A with a line of sight or perspective of the right eye of the user of the electronic eyewear device 100. The visible light camera cover lens also can be adhered to an outward facing surface of the right temple 110A in which an opening is formed with an outward facing angle of coverage, but in a different outwards direction. The coupling can also be indirect via intervening components.

The first visible light camera 114A may be connected to the first see-through image display 180C of the first optical assembly 180A to generate a first background scene of a first successive displayed image. The second visible light camera 114B may be connected to the second see-through image display 180D of the second optical assembly 180B to generate a second background scene of a second successive displayed image. The first background scene and the second background scene may partially overlap to present a three-dimensional observable area of the successive displayed image.

Flexible PCB 140A may be disposed inside the right temple 110A and coupled to one or more other components housed in the right temple 110A. Although shown as being formed on the circuit boards 140A of the right temple 110A, the first visible light camera 114A can be formed on another circuit board (not shown) in one of the left temple 110B, the hinged arm 125A, the hinged arm 125B, or the frame 105.

FIG. 2A is an illustration depicting a rear view of an example hardware configuration of an electronic eyewear device 100. As shown in FIG. 2A, the electronic eyewear device 100 is in a form configured for wearing by a user, which are eyeglasses in the example of FIG. 2A. The electronic eyewear device 100 can take other forms and may incorporate other types of frameworks, for example, a headgear, a headset, or a helmet.

In the eyeglasses example, electronic eyewear device 100 includes the frame 105 which includes the right rim 107A connected to the left rim 107B via the bridge 106, which is configured to receive a nose of the user. The right and left rims 107A and 107B include respective apertures 175A and 175B, which hold the respective optical elements 180A and 180B, such as a lens and the see-through displays 180C and 180D. As used herein, the term lens is meant to cover transparent or translucent pieces of glass or plastic having curved and flat surfaces that cause light to converge/diverge or that cause little or no convergence/divergence.

Although shown as having two optical elements 180A and 180B, the electronic eyewear device 100 can include other arrangements, such as a single optical element depending on the application or intended user of the electronic eyewear device 100. As further shown, electronic eyewear device 100 includes the right temple 110A adjacent the right lateral side 170A of the frame 105 and the left temple 110B adjacent the left lateral side 170B of the frame 105. The temples 110A and 110B may be integrated into the frame 105 on the respective sides 170A and 170B (as illustrated) or implemented as separate components attached to the frame 105 on the respective sides 170A and 170B. Alternatively, the temples 110A and 110B may be integrated into hinged arms 125A and 125B attached to the frame 105.

In the example of FIG. 2A, an eye scanner 113 is provided that includes an infrared emitter 115 and an infrared camera 120. Visible light cameras typically include a blue light filter to block infrared light detection. In an example, the infrared camera 120 is a visible light camera, such as a low-resolution video graphic array (VGA) camera (e.g., 640×480 pixels for a total of 0.3 megapixels), with the blue filter removed. The infrared emitter 115 and the infrared camera 120 may be co-located on the frame 105. For example, both are shown as connected to the upper portion of the left rim 107B. The frame 105 or one or more of the temples 110A and 110B may include a circuit board (not shown) that includes the infrared emitter 115 and the infrared camera 120. The infrared emitter 115 and the infrared camera 120 can be connected to the circuit board by soldering, for example.

Other arrangements of the infrared emitter 115 and infrared camera 120 may be implemented, including arrangements in which the infrared emitter 115 and infrared camera 120 are both on the right rim 107A, or in different locations on the frame 105. For example, the infrared emitter 115 may be on the left rim 107B and the infrared camera 120 may be on the right rim 107A. In another example, the infrared emitter 115 may be on the frame 105 and the infrared camera 120 may be on one of the temples 110A or 110B, or vice versa. The infrared emitter 115 can be connected essentially anywhere on the frame 105, right temple 110A, or left temple 110B to emit a pattern of infrared light. Similarly, the infrared camera 120 can be connected essentially anywhere on the frame 105, right temple 110A, or left temple 110B to capture at least one reflection variation in the emitted pattern of infrared light.

The infrared emitter 115 and infrared camera 120 may be arranged to face inwards towards an eye of the user with a partial or full field of view of the eye to identify the respective eye position and gaze direction. For example, the infrared emitter 115 and infrared camera 120 may be positioned directly in front of the eye, in the upper part of the frame 105 or in the temples 110A or 110B at either ends of the frame 105.

FIG. 2B is an illustration depicting a rear view of an example hardware configuration of another electronic eyewear device 200. In this example configuration, the electronic eyewear device 200 is depicted as including an eye scanner 213 on a right temple 210A. As shown, an infrared emitter 215 and an infrared camera 220 are co-located on the right temple 210A. The eye scanner 213 or one or more components of the eye scanner 213 can be located on the left temple 210B and other locations of the electronic eyewear device 200, for example, the frame 105. The infrared emitter 215 and infrared camera 220 are like that of FIG. 2A, but the eye scanner 213 can be varied to be sensitive to different light wavelengths as described previously in FIG. 2A. Similar to FIG. 2A, the electronic eyewear device 200 includes a frame 105 which includes a right rim 107A which is connected to a left rim 107B via a bridge 106. The rims 107A-B may include respective apertures which hold the respective optical elements 180A and 180B comprising the see-through displays 180C and 180D.

FIG. 2C and FIG. 2D are illustrations depicting rear views of example hardware configurations of the electronic eyewear device 100, including two different types of see-through image displays 180C and 180D. In one example, these see-through image displays 180C and 180D of optical assemblies 180A and 180B include an integrated image display. As shown in FIG. 2C, the optical assemblies 180A and 180B include a display matrix 180C and 180D of any suitable type, such as a liquid crystal display (LCD), an organic light-emitting diode (OLED) display, a waveguide display, or any other such display.

The optical assemblies 180A and 180B also includes an optical layer or layers 176A-N, which can include lenses, optical coatings, prisms, mirrors, waveguides, optical strips, and other optical components in any combination. The optical layers 176 can include a prism having a suitable size and configuration and including a first surface for receiving light from display matrix and a second surface for emitting light to the eye of the user. The prism of the optical layers 176 may extend over all or at least a portion of the respective apertures 175A and 175B formed in the rims 107A and 107B to permit the user to see the second surface of the prism when the eye of the user is viewing through the corresponding rims 107A and 107B. The first surface of the prism of the optical layers 176 faces upwardly from the frame 105 and the display matrix overlies the prism so that photons and light emitted by the display matrix impinge the first surface. The prism may be sized and shaped so that the light is refracted within the prism and is directed towards the eye of the user by the second surface of the prism of the optical layers 176. In this regard, the second surface of the prism of the optical layers 176 can be convex to direct the light towards the center of the eye. The prism can be sized and shaped to magnify the image projected by the see-through image displays 180C and 180D, and the light travels through the prism so that the image viewed from the second surface is larger in one or more dimensions than the image emitted from the see-through image displays 180C and 180D.

In another example, the see-through image displays 180C and 180D of optical assemblies 180A and 180B may include a projection image display as shown in FIG. 2D. The optical assemblies 180A and 180B include a projector 150, which may be a three-color projector using a scanning mirror, a galvanometer, a laser projector, or other types of projectors. During operation, an optical source such as a projector 150 is disposed in or on one of the temples 110A or 110B of the electronic eyewear device 100. Optical assemblies 180A and 180B may include one or more optical strips 155A-N spaced apart across the width of the lens of the optical assemblies 180A and 180B or across a depth of the lens between the front surface and the rear surface of the lens.

As the photons projected by the projector 150 travel across the lens of the optical assemblies 180A and 180B, the photons encounter the optical strips 155. When a particular photon encounters a particular optical strip, the photon is either redirected towards the user's eye, or it passes to the next optical strip. A combination of modulation of projector 150, and modulation of optical strips, may control specific photons or beams of light. In an example, a processor controls the optical strips 155 by initiating mechanical, acoustic, or electromagnetic signals. Although shown as having two optical assemblies 180A and 180B, the electronic eyewear device 100 can include other arrangements, such as a single or three optical assemblies, or the optical assemblies 180A and 180B may have different arrangements depending on the application or intended user of the electronic eyewear device 100.

As further shown in FIG. 2C and FIG. 2D, electronic eyewear device 100 includes a right temple 110A adjacent the right lateral side 170A of the frame 105 and a left temple 110B adjacent the left lateral side 170B of the frame 105. The temples 110A and 110B may be integrated into the frame 105 on the respective lateral sides 170A and 170B (as illustrated) or implemented as separate components attached to the frame 105 on the respective sides 170A and 170B. Alternatively, the temples 110A and 110B may be integrated into the hinged arms 125A and 125B attached to the frame 105.

In one example, the see-through image displays include the first see-through image display 180C and the second see-through image display 180D. Electronic eyewear device 100 may include first and second apertures 175A and 175B that hold the respective first and second optical assemblies 180A and 180B. The first optical assembly 180A may include the first see-through image display 180C (e.g., a display matrix, or optical strips and a projector in the right temple 110A). The second optical assembly 180B may include the second see-through image display 180D (e.g., a display matrix, or optical strips and a projector 150B (shown as projector 150) in right temple 110A). The successive field of view of the successive displayed image may include an angle of view between about 15° to 30°, and more specifically 24°, measured horizontally, vertically, or diagonally. The successive displayed image having the successive field of view represents a combined three-dimensional observable area visible through stitching together of two displayed images presented on the first and second image displays.

As used herein, "an angle of view" describes the angular extent of the field of view associated with the displayed images presented on each of the image displays 180C and 180D of optical assemblies 180A and 180B. The "angle of coverage" describes the angle range that a lens of visible light cameras 114A or 114B or infrared camera 220 can image. Typically, the image circle produced by a lens is large enough to cover the film or sensor completely, possibly including some vignetting (i.e., a reduction of an image's brightness or saturation toward the periphery compared to the image center). If the angle of coverage of the lens does not fill the sensor, the image circle will be visible, typically with strong vignetting toward the edge, and the effective angle of view will be limited to the angle of coverage. The "field of view" is intended to describe the field of observable area which the user of the electronic eyewear device 100 can see through his or her eyes via the displayed images presented on the image displays 180C and 180D of the optical assemblies 180A and 180B. Image display 180C of optical assemblies 180A and 180B can have a field of view with an angle of coverage between 15° to 30°, for example 24°, and have a resolution of 480×480 pixels (or greater; e.g., 720p, 1080p, 4K, or 8K).

FIG. 3 shows a cross-sectional rear perspective view of the electronic eyewear device of FIG. 2A. The electronic eyewear device 100 includes the infrared emitter 115, infrared camera 120, a frame front 330, a frame back 335, and a circuit board 340. It can be seen in FIG. 3 that the upper portion of the left rim of the frame of the electronic eyewear device 100 includes the frame front 330 and the frame back 335. An opening for the infrared emitter 115 is formed on the frame back 335.

As shown in the encircled cross-section 4 in the upper middle portion of the left rim of the frame, a circuit board, which is a flexible PCB 340, is sandwiched between the frame front 330 and the frame back 335. Also shown in further detail is the attachment of the left temple 110A to the left temple 125A via the left hinge 126A. In some examples, components of the eye movement tracker 113, including the infrared emitter 115, the flexible PCB 340, or other electrical connectors or contacts may be located on the left temple 125A or the left hinge 126A.

FIG. 4 is a cross-sectional view through the infrared emitter 115 and the frame corresponding to the encircled cross-section 4 of the electronic eyewear device of FIG. 3. Multiple layers of the electronic eyewear device 100 are illustrated in the cross-section of FIG. 4, as shown the frame includes the frame front 330 and the frame back 335. The flexible PCB 340 is disposed on the frame front 330 and connected to the frame back 335. The infrared emitter 115 is disposed on the flexible PCB 340 and covered by an infrared emitter cover lens 445. For example, the infrared emitter 115 is reflowed to the back of the flexible PCB 340. Reflowing attaches the infrared emitter 115 to contact pad(s) formed on the back of the flexible PCB 340 by subjecting the flexible PCB 340 to controlled heat which melts a solder paste to connect the two components. In one example, reflowing is used to surface mount the infrared emitter 115 on the flexible PCB 340 and electrically connect the two components. However, it should be understood that through-holes can be used to connect leads from the infrared emitter 115 to the flexible PCB 340 via interconnects, for example.

The frame back 335 includes an infrared emitter opening 450 for the infrared emitter cover lens 445. The infrared emitter opening 450 is formed on a rear-facing side of the frame back 335 that is configured to face inwards towards the eye of the user. In the example, the flexible PCB 340 can be connected to the frame front 330 via the flexible PCB adhesive 460. The infrared emitter cover lens 445 can be connected to the frame back 335 via infrared emitter cover lens adhesive 455. The coupling can also be indirect via intervening components.

In an example, the processor 932 utilizes eye tracker 113 to determine an eye gaze direction 230 of a wearer's eye 234 as shown in FIG. 5, and an eye position 236 of the wearer's eye 234 within an eyebox as shown in FIG. 6. The eye tracker 113 is a scanner which uses infrared light illumination (e.g., near-infrared, short-wavelength infrared, mid-wavelength infrared, long-wavelength infrared, or far infrared) to captured image of reflection variations of infrared light from the eye 234 to determine the gaze direction 230 of a pupil 232 of the eye 234, and also the eye position 236 with respect to a see-through display 180.

The block diagram in FIG. 7 illustrates an example of capturing visible light with cameras 114A and 114B. Visible light is captured by the first visible light camera 114A with a round field of view (FOV) 111A. A chosen rectangular first raw image 758A is used for image processing by image processor 912 (FIG. 9). Visible light is also captured by the second visible light camera 114B with a round FOV 111B. A rectangular second raw image 758B chosen by the image processor 412 is used for image processing by processor 912. The raw images 758A and 758B have an overlapping field of view 713. The processor 912 processes the raw images 758A and 758B and generates a three-dimensional image 715 for display by the displays 180.

FIG. 8A illustrates a perspective view of the shield can 142 attached to the PCB 140 and encompassing the RF electronic components within, such as the low-power wireless circuitry 924 and the high-power wireless circuitry 936 that are attached to the PCB 140. The shield can 142 inhibits and prevents an emanation of RF signals that can create electromagnetic interference (EMI). As shown in FIG. 8B, the shield can 142 is thermally and electrically connected to the ground plate 144 using leaf springs 810 attached to a side of the shield can, and the shield can provides an electrical ground for the RF electronic components.

The shield can 142 is comprised of an electrically conductive material, such as a sheet of folded metal. In the illustrated example, the shield can is rectangular and includes a planar top surface 800, a front side surface 802, a back side surface 804, a left side surface 806, and a right side surface 808. Each of these side surfaces extend between the ground plate 144 and the PCB 140 and are each perpendicular to the ground plate 144 and the top surface of PCB 140. The shield can 142 is secured to the PCB 140 top surface, such as by laser welding to a metal portion thereof, using a thermal gel, hardware, or other attachment techniques.

As shown in FIGS. 8A and 8B, the sheet metal leaf springs 810 are welded at locations 812 to the exterior of the left side wall 806 and the right side wall 808 of the shield can 142. The leaf springs 810 do not add to the stack-up thickness of the shield can. Further, by attaching the leaf springs to the sides of the shield can, rather than creating them in the top surface 800, the leaf springs don't create cutouts in the top surface 800 that would otherwise allow RF signals to be emitted therethrough. The leaf springs 810 each have protrusions 814 that extend upwardly and are connected to the ground plate 144 by a mechanical point contact to provide reliable electrical connections between shield can 142 and the ground plate 144. The pair of protrusions 814 provides extra contact points and more balanced force loading. These electrical connections are supplemented with additional conductive pressure sensitive adhesive (CPSA) 820 to provide a more complete perimetral boundary in areas where the leaf springs 810 cannot be welded on, and thermal gel is dispensed on the surface 800 to help thermally couple the shield can to the ground plate 144. The leaf spring contacts help prevent contamination of the ground plate 144.

FIG. 8C illustrates a perspective view of leaf spring 810, and FIG. 8D illustrates a side view of the leaf spring 810. The leaf spring 810 has a rectangular vertical member 822 including a pair of openings 824 for receiving alignment pins of an assembly structure, and laser welding the leaf spring 810 adjacent the openings 824 to the respective side wall of shield can 142. The leaf spring 810 has a spring arm 824 having a lower horizontal portion 826 extending horizontally from the vertical member 822. The spring arm 824 curves upwardly from the lower horizontal portion 826 to a vertically extending portion 828, and then curves to an upper horizontal portion 830 that extends back toward member 822. The spring arm 824 has a pair of laterally extending spring fingers 832 laterally extending from the upper horizontal portion 830, which spring fingers 832 are formed by a recess 834 disposed between the two protrusions 814. The leaf spring arm 824 creates a spring force to bias the protrusions 814 toward and against the ground plate 144 when assembled. The protrusions 814 have a dome shape to create a mechanical point contact, and other shapes of protrusions can be utilized as desired.

FIG. 9 depicts a high-level functional block diagram including example electronic components disposed in the electronic eyewear device 100/200. The illustrated electronic components include the processor 932, the memory 934, and the see-through image display 180C and 180D including the embedded antennas 808.

Memory 934 includes instructions for execution by processor 932 to implement functionality of eyewear 100/200, including instructions for processor 932 to control in the image 715. Processor 932 receives power from battery (not shown) and executes the instructions stored in memory 934, or integrated with the processor 932 on-chip, to perform functionality of eyewear 100/200, and communicating with external devices via wireless connections.

A user interface adjustment system 900 includes a wearable device, which is the electronic eyewear device 100 with an eye movement tracker 213 (e.g., shown as infrared emitter 215 and infrared camera 220 in FIG. 2B). User interface adjustments system 900 also includes a mobile device 990 and a server system 998 connected via various networks. Mobile device 990 may be a smartphone, tablet, laptop computer, access point, or any other such device capable of connecting with electronic eyewear device 100 using both a low-power wireless connection 925 and a high-speed wireless connection 937. Mobile device 990 is connected to server system 998 and network 995. The network 995 may include any combination of wired and wireless connections.

Electronic eyewear device 100 includes at least two visible light cameras 114 (one associated with one side (e.g., the right lateral side 170A) and one associated with the other side (e.g., left lateral side 170B). Electronic eyewear device 100 further includes two see-through image displays 180C-D of the optical assembly 180A-B (one associated with each side). Electronic eyewear device 100 also includes image display driver 942, image processor 912, low-power circuitry 920, and high-speed circuitry 930. The components shown in FIG. 9 for the electronic eyewear device 100/200 are located on one or more circuit boards, for example a PCB or flexible PCB, in the temples 110A-B as previously described. Alternatively, or additionally, the depicted components can be located in the temples, frames, hinges, or bridge of the electronic eyewear device 100. The visible light cameras 114A-B can include digital camera elements such as a complementary metal-oxide-semiconductor (CMOS) image sensor, charge coupled device, a lens, or any other respective visible or light capturing elements that may be used to capture data, including images of scenes with unknown objects.

Eye movement tracking programming 945 implements the user interface field of view adjustment instructions, including, to cause the electronic eyewear device 100 to track, via the eye movement tracker 213, the eye movement of the eye of the user of the electronic eyewear device 100. Other implemented instructions (functions) cause the electronic eyewear device 100 to determine, a field of view adjustment to the initial field of view of an initial displayed image based on the detected eye movement of the user corresponding to a successive eye direction. Further implemented instructions generate a successive displayed image of the sequence of displayed images based on the field of view adjustment. The successive displayed image is produced as visible output to the user via the user interface. This visible output appears on the see-through image displays 180C-D of optical assembly 180A-B, which is driven by image display driver 934 to present the sequence of displayed images, including the initial displayed image with the initial field of view and the successive displayed image with the successive field of view.

As shown in FIG. 9, high-speed circuitry 930 includes high-speed processor 932, memory 934, and high-speed wireless circuitry 936. In the example, the image display driver 942 is coupled to the high-speed circuitry 930 and operated by the high-speed processor 932 to drive the image displays 180C-D of the optical assembly 180A-B to create the virtual image. High-speed processor 932 may be any processor capable of managing high-speed communications and operation of any general computing system needed for electronic eyewear device 100. High-speed processor 932 includes processing resources needed for managing high-speed data transfers on high-speed wireless connection 937 to a wireless local area network (WLAN) using high-speed wireless circuitry 936. In certain examples, the high-speed processor 932 executes an operating system such as a LINUX operating system or other such operating system of the electronic eyewear device 100 and the operating system is stored in memory 934 for execution. In addition to any other responsibilities, the high-speed processor 932 executing a software architecture for the electronic eyewear device 100 is used to manage data transfers with high-speed wireless circuitry 936. In certain examples, high-speed wireless circuitry 936 is configured to implement Institute of Electrical and Electronic Engineers (IEEE) 802.11 communication standards, also referred to herein as Wi-Fi. In other examples, other high-speed communications standards may be implemented by high-speed wireless circuitry 936.

Low-power wireless circuitry 924 and the high-speed wireless circuitry 936 of the electronic eyewear device 100 can include short range transceivers (e.g., UWB or Bluetooth™) and wireless wide, local, or wide area network transceivers (e.g., cellular or WiFi) including antennas 808. Mobile device 990, including the transceivers communicating via the low-power wireless connection 925 and high-speed wireless connection 937, may be implemented using details of the architecture of the electronic eyewear device 100, as can other elements of network 995.

Memory 934 includes any storage device capable of storing various data and applications, including, among other things, color maps, camera data generated by the visible light cameras 114A-B and the image processor 912, as well as images generated for display by the image display driver 942 on the see-through image displays 180C-D of the optical assembly 180A-B. While memory 934 is shown as integrated with high-speed circuitry 930, in other examples, memory 934 may be an independent standalone element of the electronic eyewear device 100. In certain such examples, electrical routing lines may provide a connection through a chip that includes the high-speed processor 932 from the image processor 912 or low-power processor 922 to the memory 934. In other examples, the high-speed processor 932 may manage addressing of memory 934 such that the low-power processor 922 will boot the high-speed processor 932 any time that a read or write operation involving memory 934 is needed.

Server system 998 may be one or more computing devices as part of a service or network computing system, for example, that include a processor, a memory, and network communication interface to communicate over the network 995 with the mobile device 990 and electronic eyewear device 100. Electronic eyewear device 100 is connected with a host computer. For example, the electronic eyewear device 100 is paired with the mobile device 990 via the high-speed wireless connection 937 or connected to the server system 998 via the network 995.

Output components of the electronic eyewear device 100 include visual components, such as the image displays 180C-D of optical assembly 180A-B as described in FIGS. 2C-D (e.g., a display such as a liquid crystal display (LCD), a plasma display panel (PDP), a light emitting diode (LED) display, a projector, or a waveguide). The image displays 180C-D of the optical assembly 180A-B are driven by the image display driver 942. The output components of the electronic eyewear device 100 further include acoustic components (e.g., speakers), haptic components (e.g., a vibratory motor), other signal generators, and so forth. The input components of the electronic eyewear device 100, the mobile device 990, and server system 998, may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or other pointing instruments), tactile input components (e.g., a physical button, a touch screen that provides location and force of touches or touch gestures, or other tactile input components), audio input components (e.g., a microphone), and the like.

Electronic eyewear device 100 may optionally include additional peripheral device elements 919. Such peripheral device elements may include biometric sensors, additional sensors, or display elements integrated with electronic eyewear device 100. For example, peripheral device elements 919 may include any I/O components including output components, motion components, position components, or any other such elements described herein. The electronic eyewear device 100 can take other forms and may incorporate other types of frameworks, for example, a headgear, a headset, or a helmet.

For example, the biometric components of the user interface field of view adjustment may include components to detect expressions (e.g., hand expressions, facial expressions, vocal expressions, body gestures, or eye tracking), measure biosignals (e.g., blood pressure, heart rate, body temperature, perspiration, or brain waves), identify a person (e.g., voice identification, retinal identification, facial identification, fingerprint identification, or electroencephalogram based identification), and the like. The motion components include acceleration sensor components (e.g., accelerometer), gravitation sensor components, rotation sensor components (e.g., gyroscope), and so forth. The position components include location sensor components to generate location coordinates (e.g., a Global Positioning System (GPS) receiver component), WiFi or Bluetooth™ transceivers to generate positioning system coordinates, altitude sensor components (e.g., altimeters or barometers that detect air pressure from which altitude may be derived), orientation sensor components (e.g., magnetometers), and the like. Such positioning system coordinates can also be received over wireless connections 925 and 937 from the mobile device 990 via the low-power wireless circuitry 924 or high-speed wireless circuitry 936.

According to some examples, an "application" or "applications" are program(s) that execute functions defined in the programs. Various programming languages can be employed to create one or more of the applications, structured in a variety of manners, such as object-oriented programming languages (e.g., Objective-C, Java, or C++) or procedural programming languages (e.g., C or assembly language). In a specific example, a third-party application (e.g., an application developed using the ANDROID™ or IOS™ software development kit (SDK) by an entity other than the vendor of the particular platform) may be mobile software running on a mobile operating system such as IOS™, ANDROID™, WINDOWS® Phone, or other mobile operating systems. In this example, the third-party application can invoke API calls provided by the operating system to facilitate functionality described herein.

FIG. 10 is a flowchart 1000 that illustrates assembling the shield can 142 to the PCB 140 and the ground plate 144.

At block 1002, the leaf springs 810 are attached to the respective left side wall 806 and the right side wall 808 of the shield can 142. This attachment is done by inserting laterally extending alignment pins of an assembly fixture through respective openings 824 and laser welding at a location adjacent to the openings.

At block 1004, the shield can 142 is attached to the PCB 140. This can be done using a soldering process, such as surface mount soldering (SMT), or using mechanical assembly.

At block 1006, CPSA 820 is applied to the top surface 800 of the shield can 142, such as by applying a strip along the perimeter of the top surface 800. The CPSA is applied opposing edges of the top surface 800 and may also continuously extend along the entire perimeter of the top surface 800. Thermal gel is applied to the top surface 800 to help thermally couple the top surface 800 to the ground plate 144.

At block 1008, the shield can 142 is attached to the ground plate 144 using the leaf springs 810 and the CPSA 820. The protrusions 814 of the leaf fingers 832 are secured against the ground plate 144 with a mechanical point contact, and the CPSA 820 is compressed against the surface of the ground plate 144.

FIG. 11 is a method 1100 of operating the electronic eyewear device.

At block 1102, the shield can 142 is grounded to the ground plate 144, wherein the shield can encompasses the electronic components. The leaf springs 810 each provide a bias force causing the protrusions 814 to engage the ground plate, thereby providing an RF ground path from the shield can to the ground plate.

At block 1104, the shield can reduces an emanation of RF signals from the electronic components. RF signals that are generated by the electronic components from within the shield can are suppressed as the shield can functions as a Faraday cage.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," "includes," "including," or any other variation thereof, are intended to cover a non-exclusive inclusion, such that a process, method, article, or apparatus that comprises or includes a list of elements or steps does not include only those elements or steps but may include other elements or steps not expressly listed or inherent to such process, method, article, or apparatus. An element preceded by "a" or "an" does not, without further constraints, preclude the existence of additional identical elements in the process, method, article, or apparatus that comprises the element.

Unless otherwise stated, all measurements, values, ratings, positions, magnitudes, sizes, and other specifications that are set forth in this specification, including in the claims that follow, are approximate, not exact. Such amounts are intended to have a reasonable range that is consistent with the functions to which they relate and with what is customary in the art to which they pertain. For example, unless expressly stated otherwise, a parameter value or the like may vary by as much as ±10% from the stated amount.

In addition, in the foregoing Detailed Description, various features are grouped together in various examples for the purpose of streamlining the disclosure. This method of disclosure is not to be interpreted as reflecting an intention that the claimed examples require more features than are expressly recited in each claim. Rather, as the following claims reflect, the subject matter to be protected lies in less than all features of any single disclosed example. Thus, the following claims are hereby incorporated into the Detailed Description, with each claim standing on its own as a separately claimed subject matter.

While the foregoing has described what are considered to be the best mode and other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present concepts.

What is claimed is:

1. Electronic eyewear device, comprising:
    a ground plate;
    a printed circuit board (PCB) having electronic components;
    a head-mounted frame supporting the ground plate and the PCB;
    a shield can encompassing the electronic components, the shield can having a side wall extending between the ground plate and the PCB; and a leaf spring coupled to the side wall and engaging the ground plate, wherein the leaf spring has protrusions that engage the ground plate, wherein the leaf spring has a spring arm that couples the leaf spring to the side wall and extends laterally from the side wall, the spring arm configured to create a bias force of the protrusions against the ground plate.

2. The electronic eyewear device of claim 1, wherein the side wall extends perpendicular to a surface of the ground plate.

3. The electronic eyewear device of claim 1, wherein the leaf spring has a pair of symmetric leaf fingers, wherein each of the leaf fingers includes a protrusion configured to engage the ground plate.

4. The electronic eyewear device of claim 1, wherein the electronic components include radio frequency (RF) components and wherein the shield can is grounded to the ground plate.

5. The electronic eyewear device of claim 1, further comprising a conductive pressure sensitive adhesive (CPSA) disposed between the shield can and the ground plate.

6. The electronic eyewear device of claim 1, wherein the shield can is comprised of folded sheet metal.

7. A shield can configured to be disposed between a printed circuit board (PCB) having electronic components and a ground plate, the shield can having a side wall configured to extend between the PCB and the ground plate, a conductive pressure sensitive adhesive (CPSA) between the shield can and the ground plate, the shield can having a leaf spring coupled to the side wall and biased to engage the ground plate when the shield can is coupled to the ground plate, wherein the shield can is configured to reduce emanation of radio frequency (RF) signals generated by the electronic components from within the shield can.

8. A method of using an electronic eyewear device, the electronic eyewear device having a ground plate, a printed circuit board (PCB) having electronic components; a head-mounted frame supporting the ground plate and the PCB, a shield can extending between the ground plate and the PCB, the shield can having a side wall extending between the ground plate and the PCB, and a leaf spring coupled to the side wall and engaging the ground plate, wherein the leaf spring has protrusions engaging the ground plate, wherein the leaf spring has a spring arm that couples the leaf spring to the side wall and extends laterally from the side wall, the spring arm configured to create a bias force of the protrusions against the ground plate, the method comprising:
grounding the shield can to the ground plate, the shield can encompassing the electronic components; and
reducing an emanation of RF signals from the electronic eyewear device with the shield can, the RF signals generated by the electronic components from within the shield can.

9. The method of claim 8, wherein the side wall extends perpendicular to the ground plate.

10. The method of claim 1, wherein the leaf spring has a pair of symmetric leaf fingers, wherein each of the leaf fingers include a protrusion configured to engage the ground plate.

11. The method of claim 1, wherein the leaf spring does not create any openings in an upper surface of the shield can.

12. The method of claim 8, wherein the electronic components are radio frequency (RF) components, wherein the shield can is grounded to the ground plate and is configured to reduce RF signals emanating from the electronic components such that the shield can is an RF shield.

13. The method of claim 8, further comprising a conductive pressure sensitive adhesive (CPSA) disposed between the shield can and the ground plate.

14. The method of claim 8, wherein the shield can is comprised of folded sheet metal.

15. A method of coupling a shield can between a printed circuit board (PCB) having electronic components and a ground plate, the shield can having a side wall and a leaf spring extending from the side wall between the PCB and the ground plate, comprising:
coupling the shield can to the PCB such that the shield can encompasses the electronic components;
coupling the shield can to the ground plate such that the leaf spring is biased against the ground plate; and
disposing a conductive pressure sensitive adhesive (CPSA) between the shield can and the ground plate.

* * * * *